(12) United States Patent
Aram et al.

(10) Patent No.: US 6,798,597 B1
(45) Date of Patent: Sep. 28, 2004

(54) WRITE CHANNEL HAVING PREAMPLIFIER AND NON-UNIFORM TRANSMISSION LINE

(75) Inventors: Farbod Aram, Cupertino, CA (US); Leechung Yiu, Fremont, CA (US); Sehat Sutardja, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 339 days.

(21) Appl. No.: 10/051,550

(22) Filed: Jan. 18, 2002

Related U.S. Application Data
(60) Provisional application No. 60/265,578, filed on Feb. 2, 2001.

(51) Int. Cl.[7] .................................................. G11B 5/02
(52) U.S. Cl. ............................. 360/68; 360/46; 360/67
(58) Field of Search .......................... 360/67, 68, 46; 333/34

(56) References Cited

U.S. PATENT DOCUMENTS

| | | |
|---|---|---|
| 5,822,141 A | 10/1998 | Chung et al. |
| 5,880,626 A | 3/1999 | Dean |
| 5,939,940 A | 8/1999 | Patti |
| 6,040,954 A | 3/2000 | Tanghe |
| 6,107,873 A | 8/2000 | Lorenz |
| 6,175,463 B1 | 1/2001 | Nayebi et al. |
| 6,185,057 B1 | 2/2001 | Masenas |

*Primary Examiner*—David Hudspeth
*Assistant Examiner*—Daniell L Negron

(57) ABSTRACT

A high speed data transmission channel, preferably embodied in a circuit for writing to a read channel for a hard disk drive, is provided. The channel includes a preamplifier writer, a non-uniform transmission line, and a head. The writer is configured to transmit pulses to the head via the transmission line at a transmission speed. Each pulse has a pulse width. Each pulse may experience interference. The writer is also configured to eliminate interference to each pulse by causing the interference to occur in a differential mode, which causes the interference to cancel out. A transmission time for each pulse is inversely proportional to the transmission speed. The non-uniformity of the transmission line may entail an exponential broadening of a trace width of the transmission line such that when the pulse width is greater than or approximately equal to the transmission time, the pulse propagates from the writer to the head substantially undistorted.

42 Claims, 8 Drawing Sheets

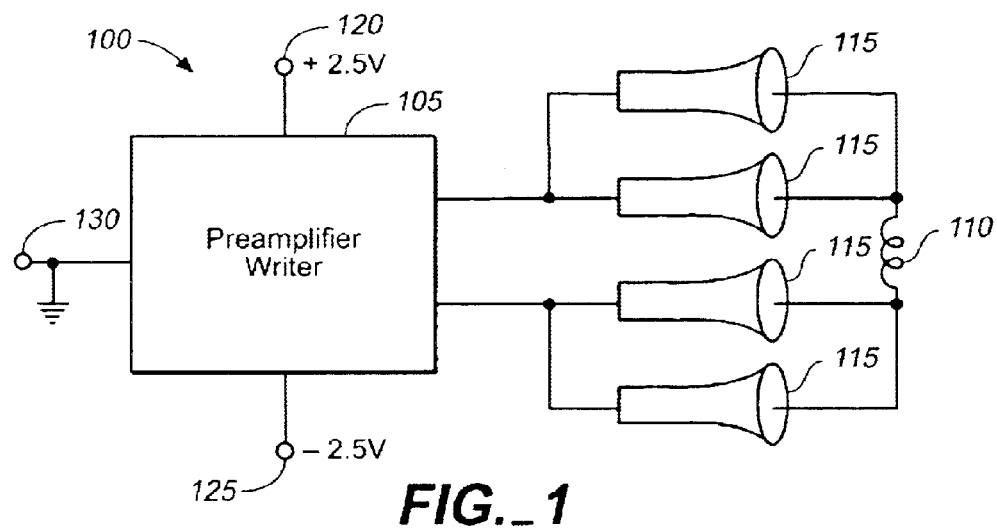
FIG._1
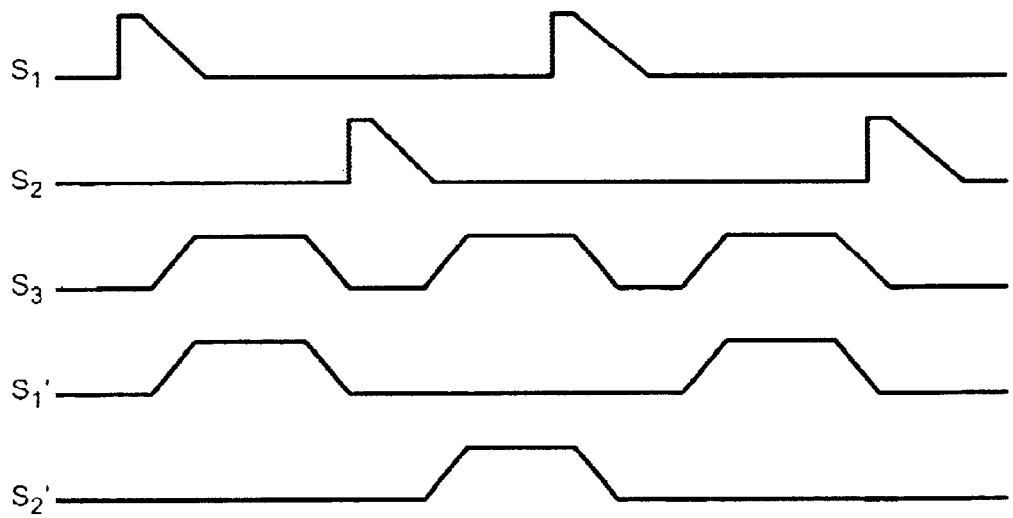
FIG._3

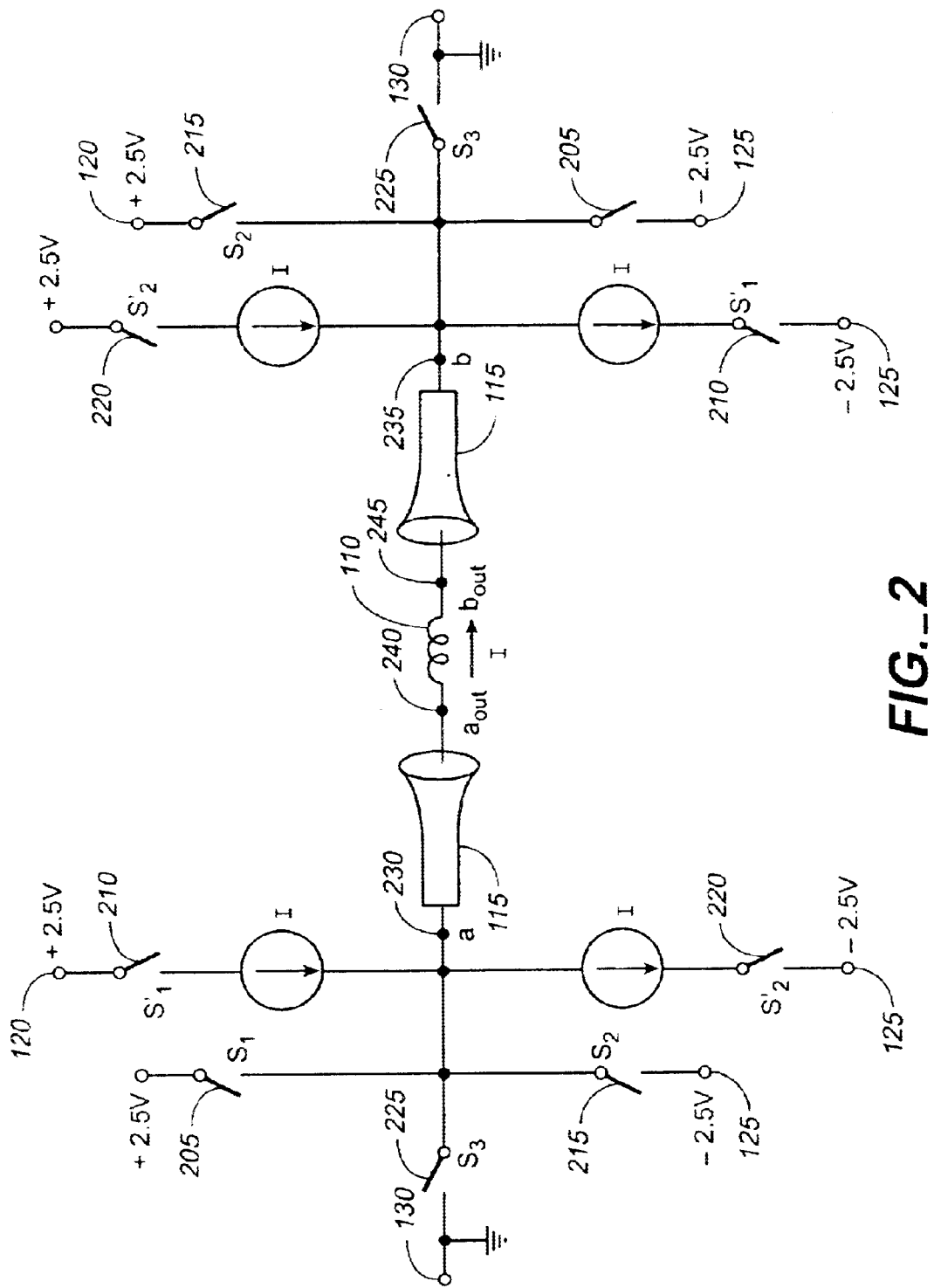
FIG._2

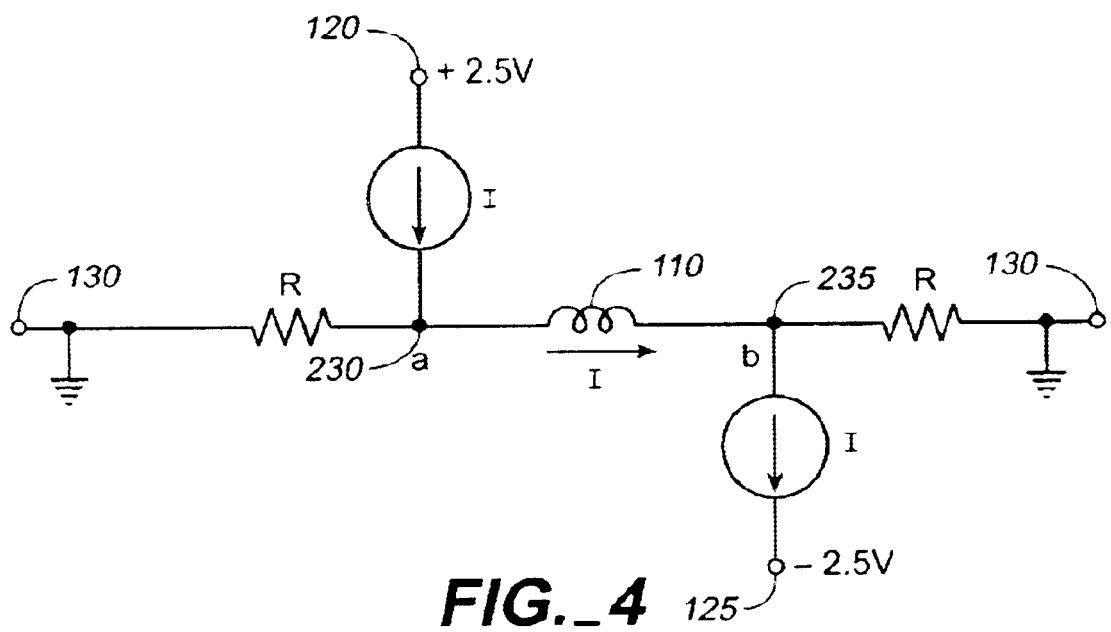
FIG._4
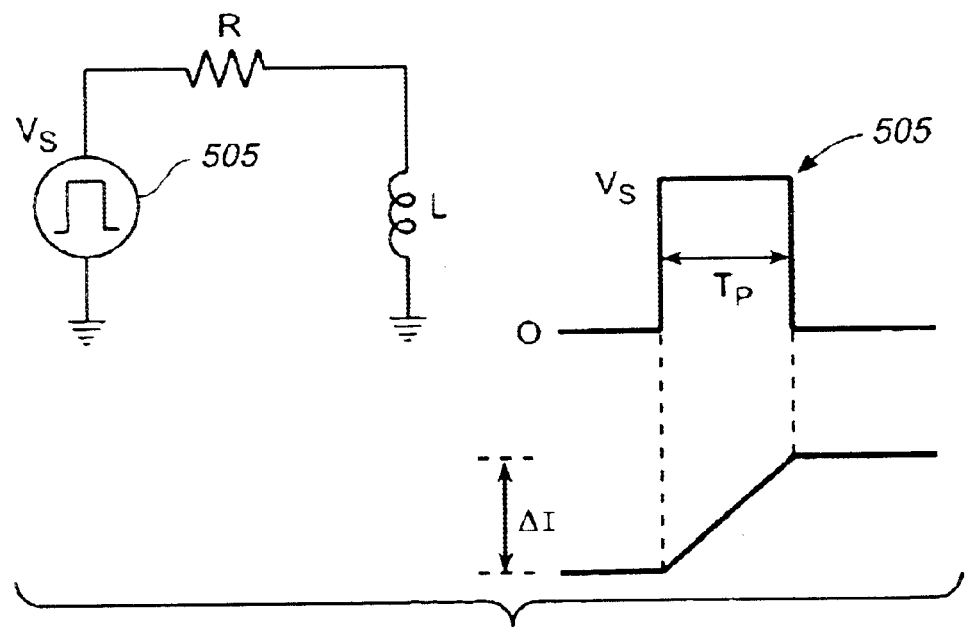
FIG._5

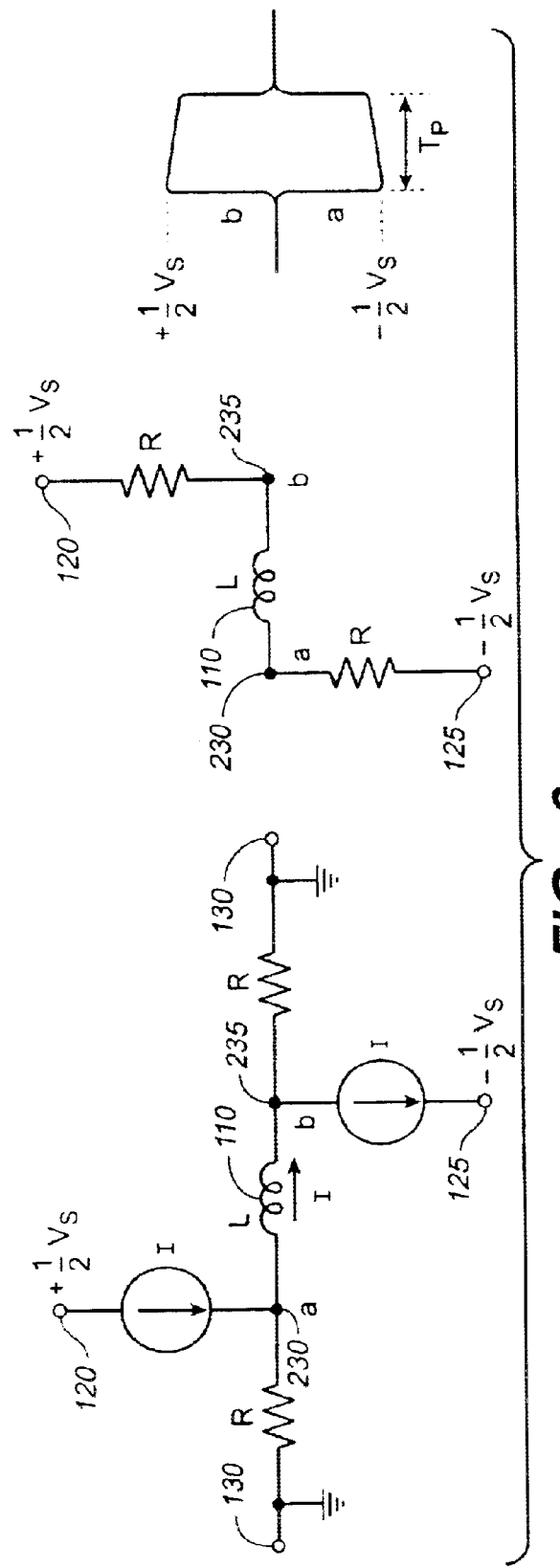
FIG._6

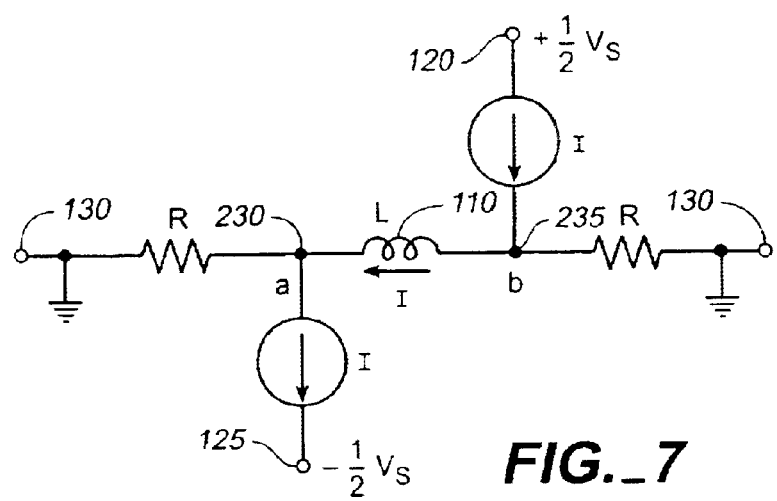
FIG._7
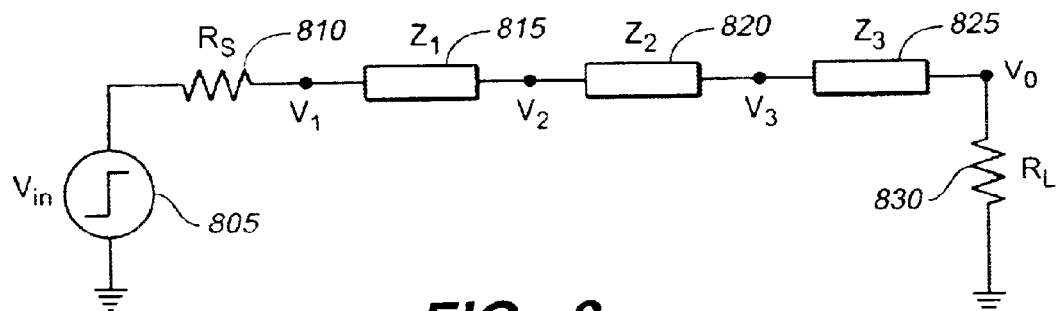
FIG._8
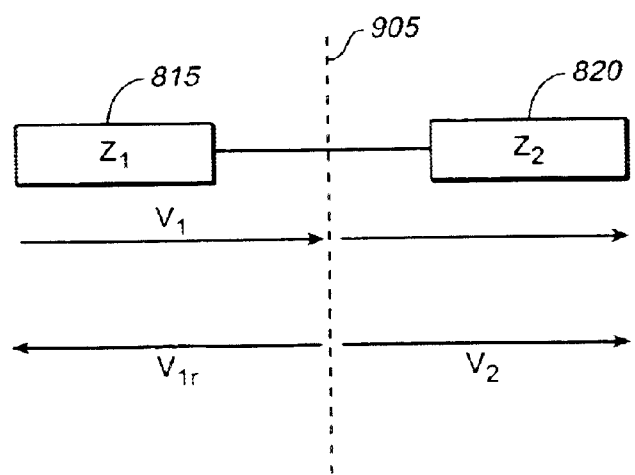
FIG._9

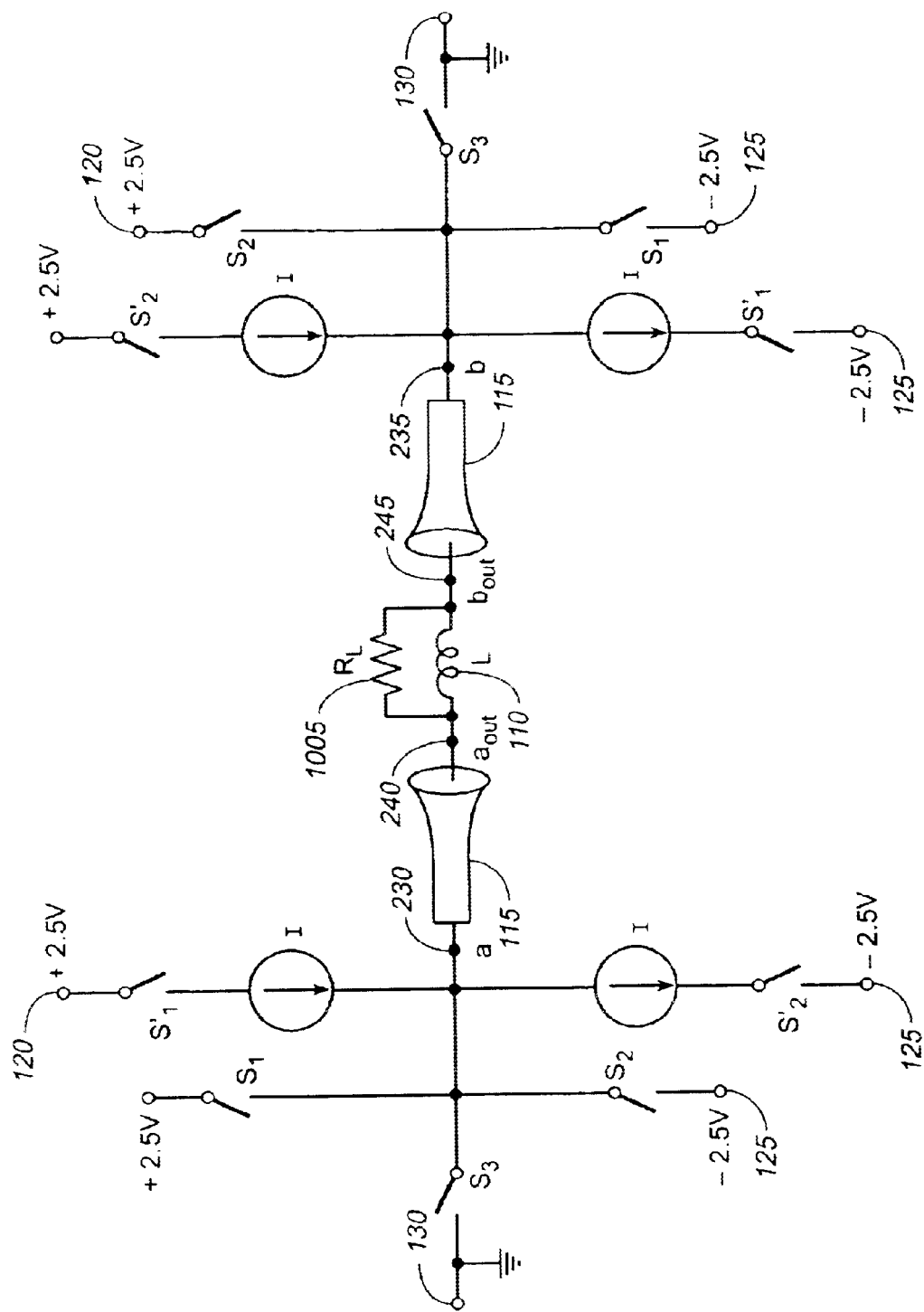
FIG._10

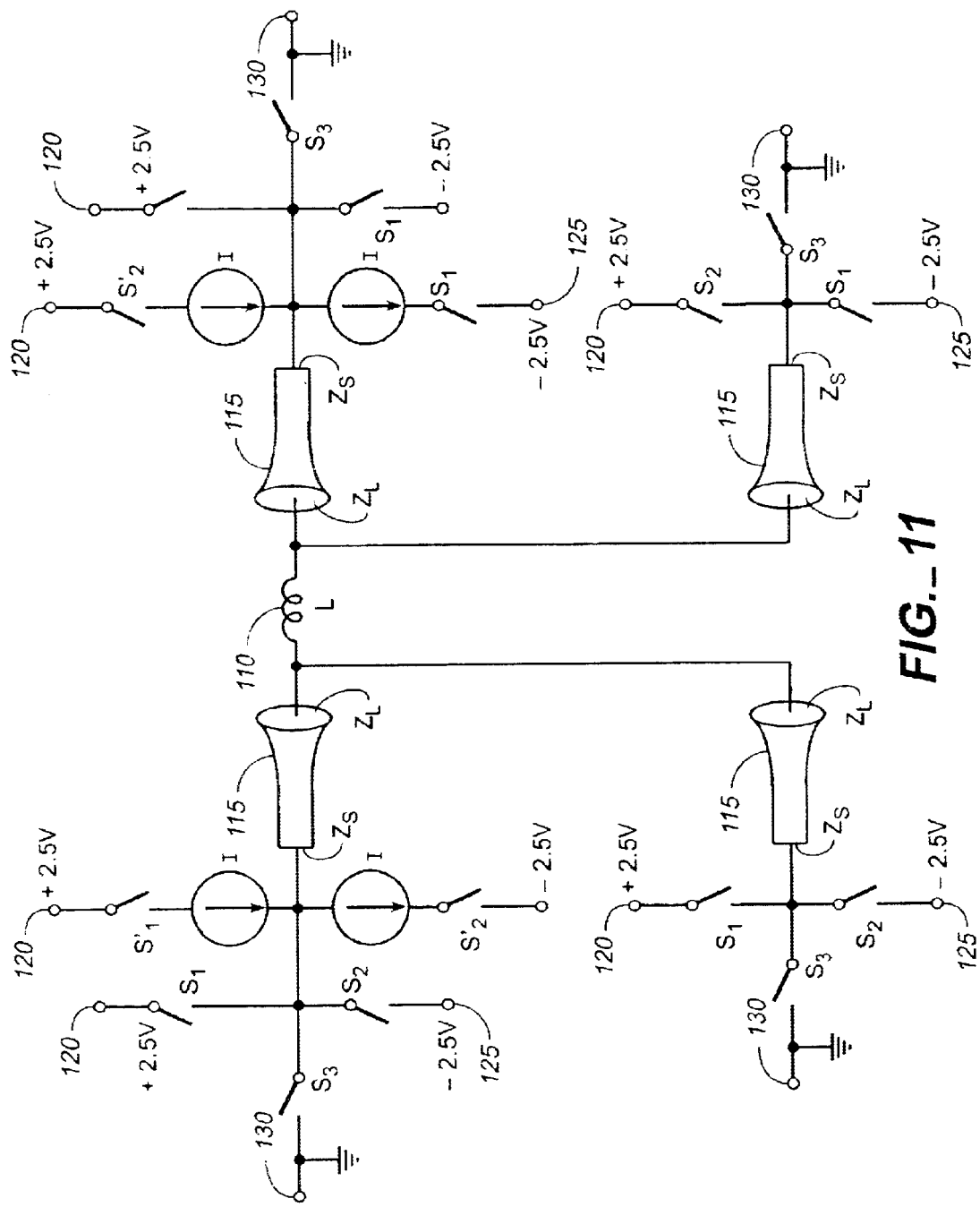
FIG._11

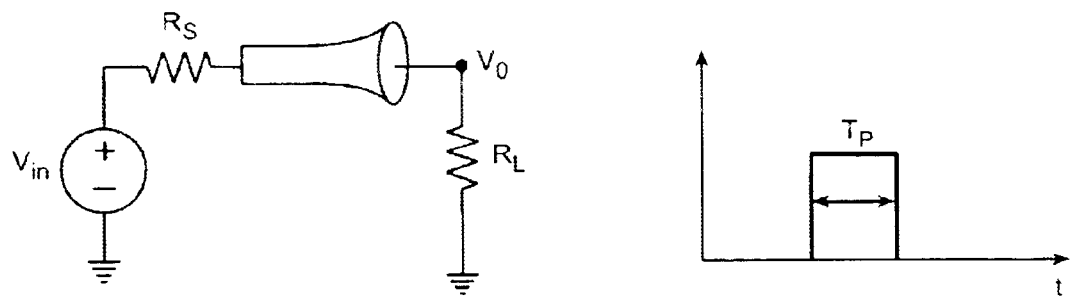
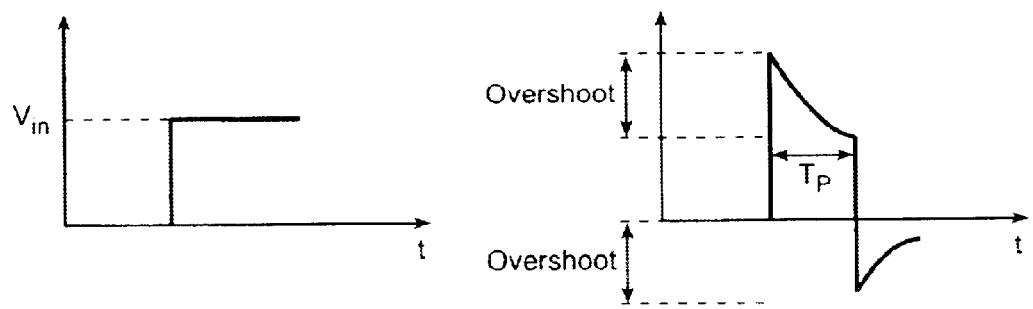
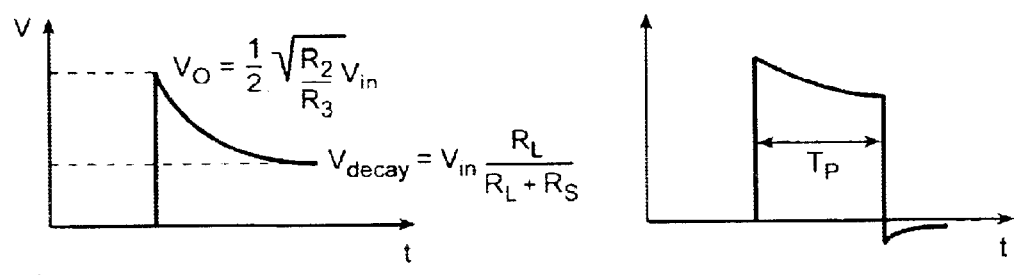
FIG._12

WRITE CHANNEL HAVING PREAMPLIFIER AND NON-UNIFORM TRANSMISSION LINE

CROSS-REFERENCE TO RELATED APPLICATIONS

This application claims priority under 35 U.S.C. 119(e) to U.S. provisional Application Ser. No. 60/265,578, entitled "Preamplifier Writer", filed 2, Feb. 2001, the contents of which are incorporated by reference herein.

BACKGROUND OF THE INVENTION

1. Field of the Invention

The present invention relates to an apparatus and a method for transmitting digital data at high speed over a transmission channel, and preferably for writing to a hard disk drive at high operating speeds.

2. Description of the Related Art

A hard disk drive uses a recording head to receive data from a device that writes, or transmits, the data. Typically, the data propagates from the writer to the head via a transmission line. The data is transmitted in the form of electrical pulses, where each electrical pulses can be characterized by a pulse width which is measured in seconds. The transmission rate of the data is an important circuit characteristic, because a higher transmission rate allows for a larger volume of information to be communicated. Therefore, a common objective of circuit designers is to increase the maximum data transmission rate. Typically, the transmitted pulse is also amplified before it is received. Thus, if there is any signal interference prior to amplification, the received signal may be distorted. Therefore, another common objective of circuit designers is to reduce or eliminate signal interference. Circuitry and transmission lines for providing high-speed communications between writing devices and receiving devices are well known in the art and are the subject of many patents.

In most cases, even when a circuit is designed to operate at a high data transmission rate, the transmission time (i.e., the length of time required for the pulse to propagate from the writer to the head) is greater than the pulse width. In these cases, there are no circuit design considerations relating to intra-pulse characteristics; the pulse is transmitted and received in an intact form. However, when a circuit is being operated at such a high speed that the transmission time is less than (or even nearly equal to) the pulse width, the circuit designer must take several intra-pulse characteristics into account, such as the rise time and fall time of the pulse and the wave propagation characteristics of the transmission line. In particular, if the voltage polarity at the writer (transmitter) changes before the previously transmitted pulse has been received at the head (receiver), then the previously transmitted pulse may be severely distorted before it is received, and the data quality may be degraded. Thus, a dilemma for writing to a hard disk drive via a high speed channel is presented.

SUMMARY OF THE INVENTION

The present invention is intended to overcome the problems noted above when the propagation time for a pulse is less than the pulse width, and provides a preamplifier writer system for a high-speed channel that preserves the integrity of transmitted pulses. In one aspect, the invention provides a circuit for writing to a read channel for a hard disk drive. The circuit may include a preamplifier writer, a non-uniform transmission line, and a head. The writer may be configured to transmit pulses having a pulse width to the head via the transmission line at a transmission speed. Each pulse may experience interference. The writer may also be configured to eliminate interference to each pulse by transmitting the pulses in a differential mode, causing the interference to be reduced. A transmission time for each pulse is inversely proportional to the transmission speed. In one aspect, the non-uniformity of the transmission line is attained by exponential broadening of a trace width of the transmission line. In another aspect, the transmission line non-uniformity is selected so that when the pulse width is greater than or approximately equal to the transmission time, the pulse propagates from the preamplifier writer to the head substantially undistorted.

BRIEF DESCRIPTION OF THE DRAWINGS

FIG. 1 shows a basic circuit architecture for a preamplifier writer to a hard disk drive.

FIG. 2 shows a more detailed circuit diagram for the preamplifier writer of FIG. 1.

FIG. 3 shows a series of on-off profiles for switches used in the preamplifier writer circuitry of FIG. 2.

FIG. 4 shows a simplified circuit diagram illustrating steady state operation of the preamplifier writer.

FIG. 5 shows a basic RL circuit and the voltage and current effects upon an RL circuit when a step voltage is applied.

FIG. 6 illustrates a transition caused by applying a step voltage in order to change the direction of a current through an inductor in the preamplifier writer.

FIG. 7 shows a simplified circuit diagram illustrating the resulting steady state operation of the preamplifier writer after the transition of FIG. 6 occurs.

FIG. 8 shows a model circuit diagram for a non-uniform transmission line.

FIG. 9 illustrates an effect of reflecting voltages due to mismatched impedances along a non-uniform transmission line.

FIG. 10 shows a circuit diagram for a preamplifier writer including a load resistor across the load inductor.

FIG. 11 shows a circuit diagram for a preamplifier writer according to the present invention including two matching pairs of non-uniform transmission lines.

FIG. 12 illustrates a relationship between impedance profile, decay rate, and circuit efficiency for a preamplifier writer according to the present invention.

DETAILED DESCRIPTION OF THE INVENTION

The present invention addresses the need for innovative circuit design characteristics to be implemented in high-speed channels, such as a read channel of a hard disk drive, when the transmission time of a pulse exceeds or approximately equals the pulse width. In the development of the present invention, the inventors have recognized that the physical characteristics of the transmission line can be chosen to effect various wave propagation effects.

Referring to FIG. 1, the basic architecture 100 of a preamplifier writer 105 to a recording head 110 of a hard disk drive is shown. The head 110 is modeled by an inductor. A channel is modeled by two pairs of non-uniform transmission lines 115 that are connected between the writer 105 and the head 110 in parallel. The transmission lines 115 are non-uniform in the sense that they each have a variable impedance. A 5-V power supply to the writer is modeled by a +2.5 V terminal 120 and a −2.5 V terminal 125; a third terminal 130 is connected to electrical ground.

Referring to FIG. 2, the circuitry of the writer 105 includes the terminals 120, 125, 130, and switches $S_1$ 205, $S_1'$ 210, $S_2$ 215, $S_2'$ 220, and $S_3$ 225. Referring also to FIG. 3, it is assumed that when the circuit 100 operates in a steady state, switches $S_3$ 225 and $S_1'$ 210 are on, and nodes a 230, b 235, $a_{out}$ 240, and $b_{out}$ 245 are all at ground. Current I is flowing through inductor L 110. Although the non-uniform transmission lines 115 are still employed, they behave like standard (uniform) transmission lines because at steady state, there are no transient pulse effects, and therefore the non-uniformities of the transmission lines do not affect the circuit operation. A simplified circuit diagram of the steady-state operation is shown in FIG. 4.

Next, it is assumed that it is desired to change the direction of the current I through the inductor L 110 (and therefore, the circuit will temporarily not operate in the steady state). Referring to FIG. 3, the switches $S_3$ and $S_1'$ open (i.e., they change from on to off), and switch $S_2$ closes briefly (i.e., it changes from off to on). Then, switch $S_2$ opens and switches $S_3$ and $S_2'$ close. Thus, in effect, the end result is a new steady state operation in which $S_3$ and $S_2'$ are on instead of $S_3$ and $S_1'$ being on; in other words, the current direction has been reversed.

By using a paired transmission line 115 and placing each switch $S_1$, $S_1'$, $S_2$, and $S_2'$ opposite its respective paired switch with respect to the voltage polarities and current sources, a differential mode is introduced to the circuit. Thus, any interference that is added to the input signal as a result of the switching operation described above is also added negatively on the other side of the circuit. For example, referring to FIG. 2, any interference that is added to the signal that is observable at node a 230 must also be added negatively to the signal that is observable at node b 235. Thus, when the paired input signal finally arrives at the head 110, the interference additively cancels itself out.

Referring to FIG. 6, the operation of the circuit during the transition from I=−50 mA to I=+50 mA is illustrated. The voltage of node a 230 shifts from ground (0 V) to −2.5 V, and the voltage of node b 235 shifts from ground to +2.5 V. The inductor L 110 acts like an open circuit. Once the voltage transient is completed, nodes a 230 and b 235 will decay back to ground with time constant=L/R. By choosing a small value of R, the decay is small, and the nodes a and b rapidly return to ground. It is noted that at all times, the voltage at node a 230 is exactly equal to the negative (i.e., the additive inverse) of the voltage at node b 235. The resulting steady state circuit is shown in FIG. 7.

The basic equation that relates voltage and current across an inductor is $$V = L*(di/dt) \quad \text{(Equation 1)}.$$

Therefore, if the current direction changes very rapidly, a high value of voltage will result. This may result in damage to a semiconductor chip on which the circuit is built. Therefore, care must be taken to ensure that the voltage does not exceed the maximum that the chip can withstand.

Equation 1 can be rewritten mathematically as follows:

$$\Delta I = (1/L)*\int Vdt \quad \text{(Equation 2)}.$$

Referring to FIG. 5, the voltage function V(t) 505 can be assumed to be a constant voltage $V_s$ for a duration $T_P$. Using this assumption, Equation 2 simplifies to $$\Delta I = (1/L)*V_s T_P \quad \text{(Equation 3)}.$$

If a conventional approach is attempted for a high-speed implementation of a writer for a hard disk drive, the following exemplary values may be used: Channel speed (data rate)=2 GHz; L=60 nH;)I=100 mA (from −50 mA to +50 mA); and $T_P$=250 ps. Therefore, $V_s$=24 V, which exceeds the maximum voltage for the chip. Thus, an alternative approach to increasing the data rate is required.

The ability to increase the data rate is determined by the ability to more quickly change the direction of the current across the inductor L 110. This results in a higher voltage $V_s$, but the voltage is limited by the semiconductor chip characteristics. Therefore, an alternative method of changing the current direction more quickly is sought. The approach taken by the present inventors is to use a non-uniform transmission line 115. Referring to FIG. 8, a simple model of a non-uniform transmission line 800 includes a voltage source 805, a source resistor 810 having resistance=$R_s$, a series of three impedances $Z_1$ 815, $Z_2$ 820, and $Z_3$ 825, and a load resistor 830 having resistance=$R_L$. The series of three impedances 815, 820, 825 represents a cascade of three separate uniform transmission lines. The voltage at a point between $R_s$ 810 and $Z_1$ 815 is designated $V_1$; the voltage at a point between $Z_1$ 815 and $Z_2$ 820 is designated $V_2$; the voltage at a point between $Z_2$ 820 and $Z_3$ 825 is designated $V_3$; and the output voltage across $R_L$ 830 is designated $V_o$.

The voltages $V_1$, $V_2$, $V_3$, and $V_o$ can be calculated as functions of $R_s$, $Z_1$, $Z_2$, $Z_3$, and $R_L$. Assuming that the voltage source 805 provides a step voltage having magnitude equal to $V_{in}$=1 V, then by using Ohm's law, it is seen that $V_1=Z_1/(Z_1+R_s)$, and the voltage $V_1$ drops across $Z_1$. Referring also to FIG. 9, once this voltage reaches the boundary 905 between $Z_1$ and $Z_2$, part of it reflects back due to the mismatched impedances. By setting $Z_2>Z_1$, the governing equations for the reflection phenomenon are $$V_{1r} = V_1*(Z_2-Z_1)/(Z_2+Z_1) \quad \text{(Equation 4)}$$

and $$V_2 = V_1*2Z_2/(Z_2+Z_1) \quad \text{(Equation 5)}.$$

Therefore, by setting $R_L>Z_3>Z_2>Z_1>R_s$, a similar set of transfer functions can be derived for $V_2$, $V_3$, and $V_o$.

By maximizing the voltage $V_o$, the rate at which the current direction can be changed will also be maximized, and therefore the data rate will also be maximized. Maximizing the voltage $V_o$ is accomplished by maximizing the transfer function shown in Equation 5. Furthermore, rather than using a cascade of only three impedances, the number of impedances being cascaded can be increased infinitely. The result of maximizing this transfer function using an infinite cascade of impedances is that a maximum value of $V_o$ is realized by exponentially increasing the impedance Z as a function of transmission line length l. Impedance profiles other than exponential, for example, a binomial sequence or a Chebyshev sequence, also provide comparable gain and may be preferable due to other practical considerations such as the decay rate of the input pulse (see discussion below). All such alternatives are included within the scope of the present invention.

One embodiment of the non-uniform transmission line may be implemented as a trace on a circuit board having a constant depth. Because impedance Z is directly proportional to each of the three spatial dimensions (i.e., length, depth, and width of the trace), an exponential increase in the impedance Z as a function of length can be implemented simply by exponentially increasing the width of the trace. This results in a horn-shaped transmission line. The governing equation for the maximized $V_o$ is $$V_o = 0.5*V_{in}*(R_L/R_s)^{1/2} \quad \text{(Equation 6)}.$$

Alternative implementations of the non-uniform transmission line include increasing the width of the trace in the circuit board according to sequences other than an exponential sequence, such as a piecewise linear sequence, a binomial sequence or a Chebyshev sequence. Other alternatives include varying the depth of the trace according to some sequential function, or varying both trace depth and trace width.

Referring to FIG. 10, the above described process results in a circuit that maximizes the load voltage $V_o$ across the inductor L 110. However, there will also be a resistance $R_L$ 1005 that is the equivalent parallel resistance to the inductor L 110, and it may be difficult to precisely ascertain the magnitude of the resistance $R_L$. This may cause ringing in the circuit.

Referring to FIG. 11, another embodiment of the invention includes a preamplifier writer that operates similarly as the writer described above with reference to FIG. 2, and a recording head that is modeled by the inductor 110. The embodiment also includes two identical pairs of non-uniform transmission lines 115 for communications between the writer and the recording head. The non-uniformities are implemented by an exponentially widening trace in a circuit board. The use of two separate pairs of transmission lines ensures that a signal that propagates along either transmission line pair will see a matched impedance at the recording head, thereby eliminating any problem of ringing that would be caused by a mismatched load impedance.

In the absence of a second pair of transmission lines, the magnitude of the ringing problem is a function of the degree to which the output impedance of the transmission line is mismatched with the equivalent parallel resistance 1005 of the inductor 110. However, the equivalent parallel resistance 1005 is not directly measurable. Therefore, if the degree of mismatch is large, for example, if the output impedance of the transmission line $Z_L=100$ Σ and the resistance 1005 $R_L=1000$ Σ, the embodiment shown in FIG. 11 would be preferable. However, if the degree of mismatch is not large, for example, if $Z_L=100$ Σ and $R_L=120$ Σ, the embodiment shown in FIG. 10 without the second pair of transmission lines would be preferable, because otherwise the gain realized by the circuit would be reduced by an unnecessary parallel load.

As an example of an impedance profile, suppose that the impedance at the beginning of the non-uniform transmission line is set to $Z_s=5$ Σ and the impedance at the end of the line is set to $Z_L=100$ Σ, and the impedance Z increases exponentially as a function of length. Setting $V_{in}=5$ V as shown in FIG. 1 and applying Equation 6, a result of $V_o=11.18$ V is obtained; this represents a gain factor of about 2.2, which translates directly to an increase in maximum operating speed of the circuit.

Another circuit design consideration is the pulse width $T_P$. Referring to FIG. 12, using a step function as an input voltage, Equation 6 provides an expression for the output voltage: $V_o=0.5*V_{in}*(R_L/R_s)^{1/2}$. However, the output voltage will immediately begin to decay to $V_{decay}=V_{in}*R_L/(R_L+R_s)$ (Equation 7). The difference between $V_o$ and $V_{decay}$ equates to an "overshoot" that occurs at the pulse transitions, and the magnitude of the overshoot directly affects the circuit efficiency. The rate of decay is dependent upon the impedance profile of the non-uniform transmission line. It has been found that for optimum performance, the pulse width $T_P$ should be chosen such that it is less than 90% of the time required for the output voltage from $V_o$ to $V_{decay}$. However, the pulse width $T_P$ is also directly proportional to the change in current) I. Hence, a wider pulse width $T_P$ results in a more efficient circuit (i.e., less overshoot). Therefore, the pulse width $T_P$ should be maximized within the decay rate criterion described above, and the decay rate is a design consideration affecting the choice of impedance profile for the non-uniform transmission lines.

While the present invention has been described with respect to what is presently considered to be the preferred embodiments, i.e., an implementation in a hard disk drive, it is to be understood that the invention is not limited to the disclosed embodiments. To the contrary, the invention is intended to cover various modifications and equivalent arrangements included within the spirit and scope of the appended claims. For example, it is to be understood that the invention is applicable to other data transmission circuitry such as optical and magnetic read circuits, cellular telephony, and digital electronic transmitters and receivers. The scope of the following claims is to be accorded the broadest interpretation so as to encompass all such modifications and equivalent structures and functions.

What is claimed is:

1. A circuit to drive an inductive head, comprising:
   a preamplifier writer configured to transmit pulses to the inductive head at a transmission speed, a transmission time for each pulse being inversely proportional to the transmission speed; and
   a non-uniform transmission line having a variable characteristic impedance, coupled between the inductive head and the preamplifier writer such that transmit pulses are conducted over the non-uniform transmission line and the variable characteristic impedance is greater near the inductive head than near the preamplifier writer.

2. The circuit of claim 1 wherein the variable impedance characteristic conforms to an impedance profile selected from the group consisting of exponentially increasing, binomial sequence, and Chebyshev sequence.

3. The circuit of claim 1 wherein the non-uniform transmission line includes a trace having a width that increases from the preamplifier writer to the inductive head such that the variable characteristic impedance increases from the preamplifier writer to the inductive head.

4. The circuit of claim 3 wherein the trace width exponentially increases in width from the preamplifier writer to the inductive head.

5. The circuit of claim 3 wherein the trace width is varied so that a transmit pulse having a pulse width that is at least equal to the transmission time propagates from the preamplifier writer to the inductive head substantially undistorted.

6. The circuit of claim 1 wherein the non-uniform transmission line includes at least two uniform transmission lines coupled in series, a first one of the at least two uniform transmission lines coupled to the preamplifier writer and having a first characteristic impedance, a last one of the at least two uniform transmission lines coupled to the inductive head and having a last characteristic impedance, the last characteristic impedance being greater than the first characteristic impedance.

7. The circuit of claim 6 wherein the at least two uniform transmission lines include a third uniform transmission line coupled between the first one and the second one of the at least two uniform transmission lines, the third uniform transmission line having a third characteristic impedance greater than the first characteristic impedance and less than the last characteristic impedance.

8. The circuit of claim 1 wherein the preamplifier writer includes a first driver and a second driver configured to provide differential mode drive to the inductive head; and the non-uniform transmission line including a first transmission line having a variable characteristic impedance coupled between the first driver and the inductive head and a second transmission line having a variable characteristic impedance coupled between the second driver and the inductive head, the first driver variable characteristic impedance substantially equal to the second driver variable characteristic impedance.

9. A circuit to drive an inductive head, comprising:

a preamplifier writer configured to transmit pulses to the inductive head at a transmission speed, a transmission time for each pulse being inversely proportional to the transmission speed, the preamplifier writer including a first driver and a second driver configured to provide differential mode drive to the inductive head; and a first transmission line having a variable characteristic impedance coupled between the first driver and the inductive head, the first transmission line variable characteristic impedance near the inductive head being greater than the first transmission line variable characteristic impedance near the first driver; and a second transmission line having a variable characteristic impedance coupled between the second driver and the inductive head, the second transmission line variable characteristic impedance near the inductive head being greater than the second transmission line variable characteristic impedance near the first driver.

10. The circuit of claim 9 wherein the first transmission line variable characteristic impedance is substantially equal to the second transmission line variable characteristic impedance.

11. The circuit of claim 9 wherein the first transmission line variable impedance characteristic and the second transmission line variable impedance characteristic each conform to an impedance profile selected from the group consisting of exponentially increasing, binomial sequence, and Chebyshev sequence.

12. The circuit of claim 11 wherein the first transmission line variable characteristic impedance is substantially equal to the second transmission line variable characteristic impedance.

13. The circuit of claim 10 wherein the first transmission line and the second transmission line each include a trace having a width that increases from the preamplifier writer to the inductive head such that the first transmission line variable characteristic impedance and the second transmission line variable characteristic impedance each increases from the preamplifier writer to the inductive head.

14. The circuit of claim 13 wherein the first transmission line trace width and the second transmission line trace width each increases exponentially in width from the preamplifier writer to the inductive head.

15. The circuit of claim 13 wherein first transmission line trace width and the second transmission line trace width are each varied so that a transmit pulse having a pulse width that is at least equal to the transmission time propagates from the preamplifier writer to the inductive head substantially undistorted.

16. The circuit of claim 10 wherein the first transmission line and the second transmission line each includes at least two uniform transmission lines coupled in series, a first one of the at least two uniform transmission lines coupled to the preamplifier writer and having a first characteristic impedance, a last one of the at least two uniform transmission lines coupled to the inductive head and having a last characteristic impedance, the last characteristic impedance being greater than the first characteristic impedance.

17. The circuit of claim 16 wherein the at least two uniform transmission lines include a third uniform transmission line coupled between the first one and the second one of the at least two uniform transmission lines, the third uniform transmission line having a third characteristic impedance greater than the first characteristic impedance and less than the last characteristic impedance.

18. A circuit to drive an inductive head, comprising:

means for transmitting pulses to the inductive head at a transmission speed, a transmission time for each pulse being inversely proportional to the transmission speed; and means for conducting the pulses between the means for transmitting and the inductive head, the means for conducting having a variable characteristic impedance, the variable characteristic impedance being greater near the inductive head than near the means for transmitting.

19. The circuit of claim 18 wherein the variable impedance characteristic conforms to an impedance profile selected from the group consisting of exponentially increasing, binomial sequence, and Chebyshev sequence.

20. The circuit of claim 18 wherein the means for conducting includes a trace having a width that increases from the means for transmitting to the inductive head such that the variable characteristic impedance increases from the means for transmitting to the inductive head.

21. The circuit of claim 20 wherein the trace width exponentially increases in width from the means for transmitting to the inductive head.

22. The circuit of claim 20 wherein the trace width is varied so that a transmit pulse having a pulse width that is at least equal to the transmission time propagates from the means for transmitting to the inductive head substantially undistorted.

23. The circuit of claim 18 wherein the means for conducting includes at least two uniform transmission lines coupled in series, a first one of the at least two uniform transmission lines coupled to the means for transmitting and having a first characteristic impedance, a last one of the at least two uniform transmission lines coupled to the inductive head and having a last characteristic impedance, the last characteristic impedance being greater than the first characteristic impedance.

24. The circuit of claim 23 wherein the at least two uniform transmission lines include a third uniform transmission line coupled between the first one and the second one of the at least two uniform transmission lines, the third uniform transmission line having a third characteristic impedance greater than the first characteristic impedance and less than the last characteristic impedance.

25. The circuit of claim 18 wherein the means for transmitting includes a first driver and a second driver configured to provide differential mode drive to the inductive head; and the means for conducting including a first transmission line having a variable characteristic impedance coupled between the first driver and the inductive head and a second transmission line having a variable characteristic impedance coupled between the second driver and the inductive head, the first driver variable characteristic impedance substantially equal to the second driver variable characteristic impedance.

26. A circuit to drive an inductive head, comprising:

means for transmitting configured to transmit pulses to the inductive head at a transmission speed, a transmission time for each pulse being inversely proportional to the transmission speed, the means for transmitting including a first driver and a second driver configured to provide differential mode drive to the inductive head; and first means for conducting having a variable characteristic impedance coupled between the first driver and the inductive head, the first means for conducting variable characteristic impedance near the inductive head being greater than the first means for conducting variable characteristic impedance near the first driver; and second means for conducting having a variable characteristic impedance coupled between the second driver and the inductive head, the second means for conducting variable characteristic impedance near the inductive head being greater than the second means for conducting variable characteristic impedance near the first driver.

27. The circuit of claim 26 wherein the first means for conducting variable characteristic impedance is substantially equal to the second means for conducting variable characteristic impedance.

28. The circuit of claim 26 wherein the first means for conducting variable impedance characteristic and the second means for conducting variable impedance characteristic each conform to an impedance profile selected from the group consisting of exponentially increasing, binomial sequence, and Chebyshev sequence.

29. The circuit of claim 28 wherein the first means for conducting variable characteristic impedance is substantially equal to the second means for conducting variable characteristic impedance.

30. The circuit of claim 27 wherein the first means for conducting and the second means for conducting each include a trace having a width that increases from the means for transmitting to the inductive head such that the first means for conducting variable characteristic impedance and the second means for conducting variable characteristic impedance each increases from the means for transmitting to the inductive head.

31. The circuit of claim 30 wherein the first means for conducting trace width and the second means for conducting trace width each increases exponentially in width from the means for transmitting to the inductive head.

32. The circuit of claim 30 wherein first means for conducting trace width and the second means for conducting trace width are each varied so that a transmit pulse having a pulse width that is at least equal to the transmission time propagates from the means for transmitting to the inductive head substantially undistorted.

33. The circuit of claim 27 wherein the first means for conducting and the second means for conducting each includes at least two uniform transmission lines coupled in series, a first one of the at least two uniform transmission lines coupled to the means for transmitting and having a first characteristic impedance, a last one of the at least two uniform transmission lines coupled to the inductive head and having a last characteristic impedance, the last characteristic impedance being greater than the first characteristic impedance.

34. The circuit of claim 33 wherein the at least two uniform transmission lines include a third uniform transmission line coupled between the first one and the second one of the at least two uniform transmission lines, the third uniform transmission line having a third characteristic impedance greater than the first characteristic impedance and less than the last characteristic impedance.

35. A method of driving an inductive head, comprising:

providing a non-uniform transmission line having a variable characteristic impedance;

arranging the variable characteristic impedance to be greater near the inductive head than near the means for transmitting; and transmitting pulses at a transmission speed over the non-uniform transmission line to the inductive head, a transmission time for each pulse being inversely proportional to the transmission speed.

36. The method of claim 35 further comprising setting the variable impedance characteristic to conform to an impedance profile selected from the group consisting of exponentially increasing, binomial sequence, and Chebyshev sequence.

37. The method of claim 35 wherein the non-uniform transmission line includes a trace having a width and providing the non-uniform transmission line includes increasing the trace width near the inductive head such that the variable characteristic impedance is increased near the inductive head.

38. The method of claim 37 wherein the non-uniform transmission line has a length and wherein increasing the trace width includes exponentially increasing the trace width along the length of the non-uniform transmission line towards the inductive head.

39. The method of claim 37 further comprising varying the trace width so that a transmit pulse having a pulse width that is at least equal to the transmission time propagates from the means for transmitting to the inductive head substantially undistorted.

40. The method of claim 35 wherein providing the non-uniform transmission line includes coupling at least two uniform transmission lines in series, a first one of the at least two uniform transmission lines having a first characteristic impedance, a last one of the at least two uniform transmission lines coupled to the inductive head and having a last characteristic impedance, the last characteristic impedance being greater than the first characteristic impedance.

41. The method of claim 40 wherein coupling the at least two uniform transmission lines in series includes coupling a third uniform transmission line between the first one and the second one of the at least two uniform transmission lines, the third uniform transmission line having a third characteristic impedance greater than the first characteristic impedance and less than the last characteristic impedance.

42. The method of claim 35 wherein transmitting includes differentially transmitting the pulses to the inductive head.

* * * * *